United States Patent
Matsui (12)

(10) Patent No.: US 6,972,890 B2
(45) Date of Patent: Dec. 6, 2005

(54) MEMS MIRROR DEVICE AND OPTICAL DISK APPARATUS

(75) Inventor: Tsutomu Matsui, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 10/839,174

(22) Filed: May 6, 2004

(65) Prior Publication Data

US 2005/0002085 A1    Jan. 6, 2005

(30) Foreign Application Priority Data

May 7, 2003    (JP) ................. P2003-128559

(51) Int. Cl.⁷ .................. G02B 26/00; G02B 26/08; G11B 7/00; G11B 1/135
(52) U.S. Cl. ............... 359/290; 359/224; 369/44.14; 369/112.29
(58) Field of Search ................... 359/224, 290; 369/44.15, 112.29

(56) References Cited

FOREIGN PATENT DOCUMENTS

JP    A-64-073536    3/1989

*Primary Examiner*—David N. Spector
(74) *Attorney, Agent, or Firm*—Morgan, Lewis & Bockius LLP

(57) ABSTRACT

A MEMS mirror device includes a rectangular frame, a mirror unit having a reflecting portion on one face thereof and connected via the hinges inside the frame, and a drive unit for tilting the mirror unit around the hinges as the axis, wherein the frame has two protruding portions spaced at a regular interval and extending into the frame on both sides of a connected portion with the hinge, and an elastic member is provided to bridge the hinge between two protruding portions.

7 Claims, 6 Drawing Sheets

MEMS MIRROR DEVICE AND OPTICAL DISK APPARATUS

BACKGROUND OF THE INVENTION

1. Field of the Invention

The present invention relates to an MEMS (Micro Electro Mechanical System) mirror device constituted in small size employing the MEMS technique and an optical disk apparatus having the MEMS mirror device.

2. Description of the Related Art

The conventional optical disk apparatus includes a light source (semiconductor laser: LD), an objective lens for focusing a laser beam from the light source onto the surface of a recording medium such as an optical disk, a photodetector for detecting various kinds of signal from the light reflected from the recording medium, a beam splitter for leading the laser beam to proceed on a predetermined route, a collimator lens for transforming laser beam into a parallel light and a condensing lens for condensing the parallel light.

Also, the objective lens is secured to an actuator for making the focusing control for focusing a focusing point (light spot) of laser beam on the recording medium in accordance with irregularities or vibration of the recording medium, and the tracking control for tracking the light spot on the track formed on the recording medium. This actuator has the objective lens supported on a base board by a support member having a parallel leaf spring with a support and restoring force in the vertical direction (focusing direction) to the surface of the recording medium and the hinges made of synthetic resin with a support and restoring force against the rotation in the radial direction (tracking direction), such that the objective lens can be driven in the focusing direction and the tracking direction by electromagnetic means consisting of the permanent magnets and an electromagnetic coil.

By the way, such an actuator mechanism has many natural vibration modes. And when the natural vibration mode is excited at the natural frequency to generate resonance, a control system is unstable to make the correct focusing difficult. At this time, because the degree of instability in the control system is increased or decreased depending on the resonance peak amount at the resonance frequency, it is desired that the resonance peak amount is smaller. For example, in JP-A-64-73536, there was disclosed a technique for decreasing the resonance peak amount of the actuator by appending with the hinge an elastic body made of different material from the hinge.

By the way, along with the higher density of the recording medium in recent years, the track pitch (interval between track grooves) is smaller (e.g., 1. m or less), and there is an increasing need for the finer tracking control, whereby the actuator may not often make the tracking control sufficiently.

Thus, in recent year, an electromechanical component called an MEMS mirror device having a mirror face tiltable by a minute angle is provided in a pickup system, in which light from the light source is reflected from the MEMS mirror device and applied via the objective lens onto the recording medium. Herein, MEMS (Micro Electro Mechanical System) is the technique for constructing the minute electromechanical component with a combination of electron and mechanical parts, employing the semiconductor process technique (photolithography technique). At present, in the mechanical, optical and fluid fields, the minute mechanical parts or modules have been constructed in micro or composite form by the MEMS technique, and among others, the MEMS mirror device has the mirror of small size for reflecting the light.

FIG. 6 is a schematic view showing the constitution of the conventional electromagnetic MEMS mirror device.

The MEMS mirror device 100 has a rectangular mirror unit 102 with a reflecting face 103 formed by gold deposition on one face, which is connected via two hinges 104, 104 to the inside of a rectangular frame 101', as shown in shown in FIG. 6.

On the back face of the mirror unit 102, an electromagnetic coil (not shown) wound around the peripheral part of the mirror unit 102 is wired, its end portion being electrically connected to an electrode pad (not shown) extending from the left and right hinges 104, 104 and provided in the frame 101'. Also, on the sides of the frame 101' parallel to the hinges 104, the permanent magnets 105A, 105B are arranged to generate a magnetic field to cause a Lorentz force in the thickness direction of the mirror unit 102 in an area of the electromagnetic coil parallel to the hinges 104 when a current is flowed through the electromagnetic coil. The electromagnetic coil and the permanent magnets constitute drive means for the mirror unit.

When a current is flowed through the electromagnetic coil, a Lorentz force is caused in the thickness direction of the mirror unit 102 due to interaction with magnetic field generated by the permanent magnets 105A, 105B in a portion (parallel to the hinges 104) closer to the permanent magnets 105A, 105B of the electromagnetic coil. As a result, the mirror unit 102 is oscillated around two hinges 104 as the axis, and stands still at an angle where the Lorentz force and a torsional rigidity are balanced. At this time, the mirror unit 102 is tilted by a desired angle by changing the magnitude of current flowing through the electromagnetic coil, making it possible to control the optical path of light reflected from the MEMS mirror.

That is, in the optical disk apparatus with the above constitution, since the MEMS mirror device allows the light spot to be moved radially on the recording medium by a small amount, whereby it is possible to make the finer tracking control than the actuator. For example, coarse adjustment is made in a low frequency domain (e.g., below 2 kHz) by the actuator, and fine adjustment is made in a high frequency domain (e.g., from 2 to 10 kHz) by the MEMS mirror device.

By the way, in the optical disk apparatus with the above constitution, it is desirable that the resonance peak amount of the MEMS mirror device, like the actuator, is 15 dB or less to make the stable tracking control. However, the resonance peak amount of the conventional MEMS mirror device is about 30 dB, so that the control system is unstable at this resonance frequency, resulting in a problem that the stable tracking control is not made.

SUMMARY OF THE INVENTION

It is an object of the invention to provide an MEMS mirror device with reduced resonance peak amount at a resonance frequency and an optical disk apparatus capable of making the correct tracking control with the MEMS mirror device.

This invention has been achieved to achieve the above object, and provides an MEMS mirror device including a rectangular frame, a mirror unit having a reflecting portion on one face thereof and connected via the hinges inside the frame, and a drive unit for tilting the mirror unit around the hinges as the axis, wherein the frame has two protruding portions spaced at a regular interval and extending into the frame on both sides of a connected portion with the hinge, and an elastic member is provided to bridge the hinge between two protruding portions. Also, the elastic member is formed of high molecular resin (e.g., silicone) cured like gel by UV irradiation.

The elastic member is easily formed by providing the protruding portions on both sides of the connecting portion between the frame and the hinge as described above. That is, when UV curable resin material such as silicone is coated between two protruding portions formed in the frame, and cured like gel by UV irradiation, a liquid pool is formed between the protruding portions and the hinge, whereby the sol-like resin is easily coated to bridge the hinge between two protruding portions.

Also, the resonance peak amount of the MEMS mirror device is reduced by forming the elastic member in the connecting portion between the frame and the hinge, whereby the optical disk apparatus having the MEMS mirror device can make the stable tracking control.

The resin material is curing like gel in the above description, but may be cured like gel near the sol to reduce the resonance peak of the MEMS mirror device.

Also, the frame, the mirror unit, and the hinges of the MEMS mirror device are integrally formed of the same material. For example, a single substrate material such as Si substrate is subject to micro processing by dry etching to integrally form those parts. Thereby, there is no need for adding a step for providing the protruding portions on both sides of the connecting portion between the frame and the hinge, and those parts are formed relatively easily.

Also, the drive unit is composed of an electromagnetic coil wired on the other face of the mirror unit on which a reflecting portion is provided, and the permanent magnets for generating a magnetic field to cause a Lorentz force in the thickness direction of the mirror unit in a predetermined part of the electromagnetic coil in flowing a current through the electromagnetic coil. Thereby, the oscillation of the mirror unit is controlled employing the Lorentz force acting on the electromagnetic coil.

Moreover, the electromagnetic coil is wired like eight-figure, and the permanent magnet is magnetized to generate a magnetic field like closed loop in a predetermined portion of the electromagnetic coil. Thereby, the intensity of magnetic field in the predetermined portion of the electromagnetic coil is stabilized, and the electromagnetic conversion efficiency is improved, whereby the operation characteristics of the MEMS mirror are improved.

Also, the resonance peak of the MEMS mirror device is remarkably smaller than the conventional MEMS mirror device, whereby the stable tracking control is enabled by providing the MEMS mirror in the optical disk apparatus.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

The preferred embodiments of the present invention will be described below with reference to the accompanying drawings.

(First Embodiment)

Figure 1:
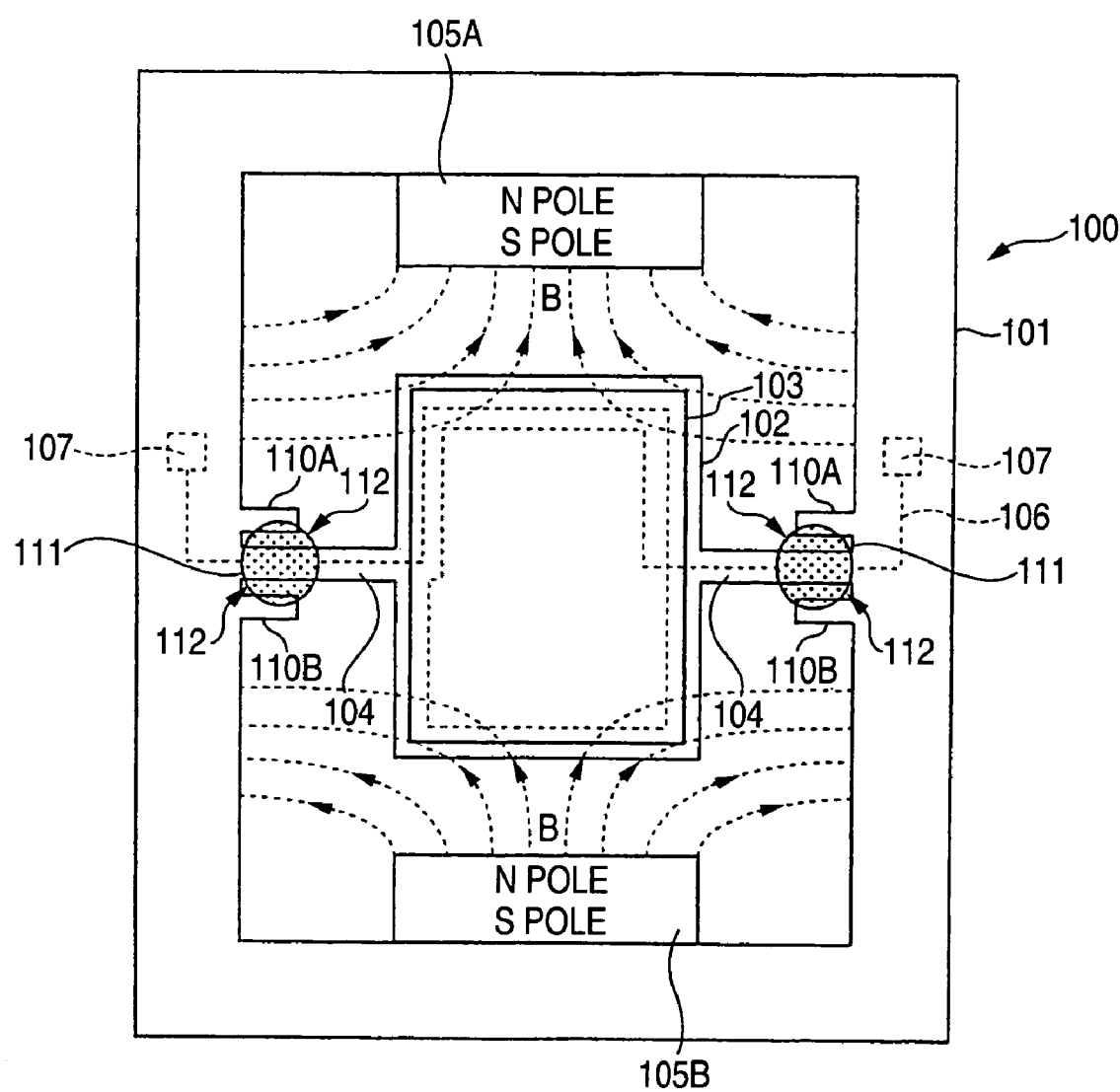
FIG. 1 is an upper view showing the schematic constitution of an MEMS mirror device 100 according to a first embodiment of the present invention.
Figure 2:
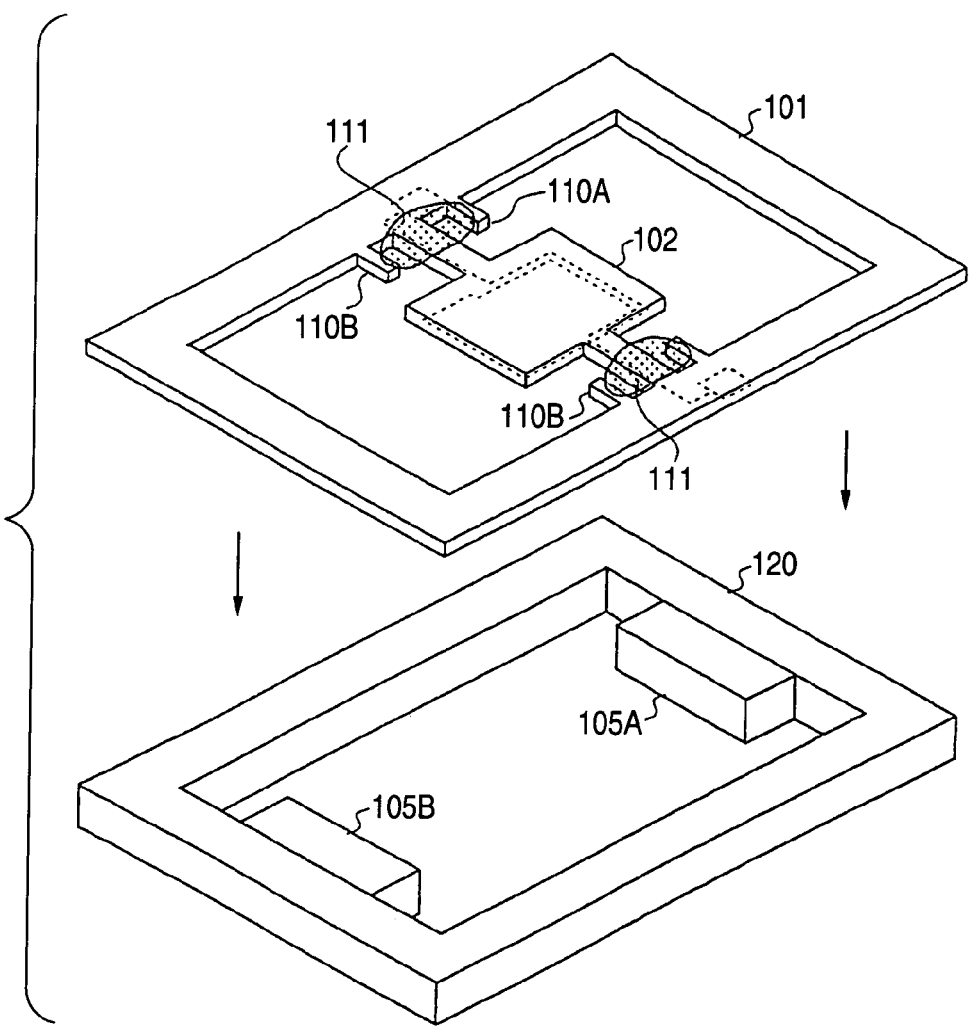
FIG. 2 is an exploded perspective view showing the schematic constitution of the MEMS mirror device 100 according to the first embodiment.
Figure 3A:
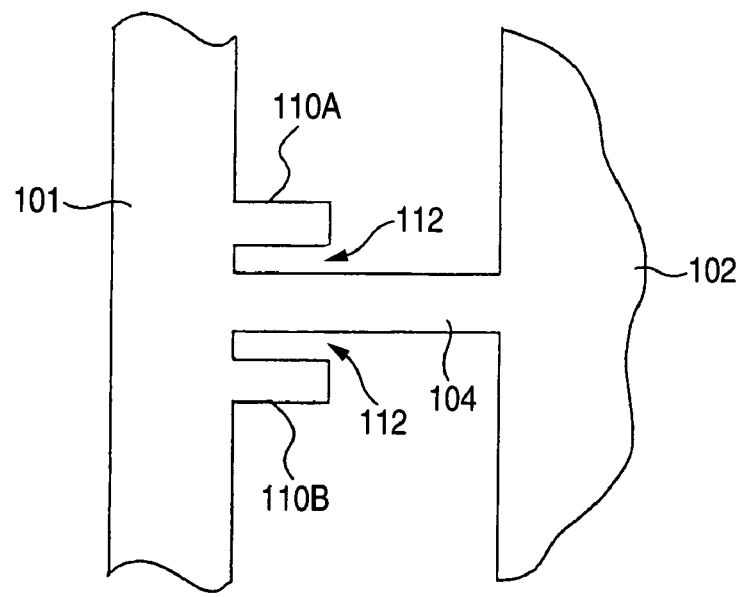
FIGS. 3A and 3B are enlarged views of a connecting portion between the first frame 101 and the hinge 104.
Figure 3B:
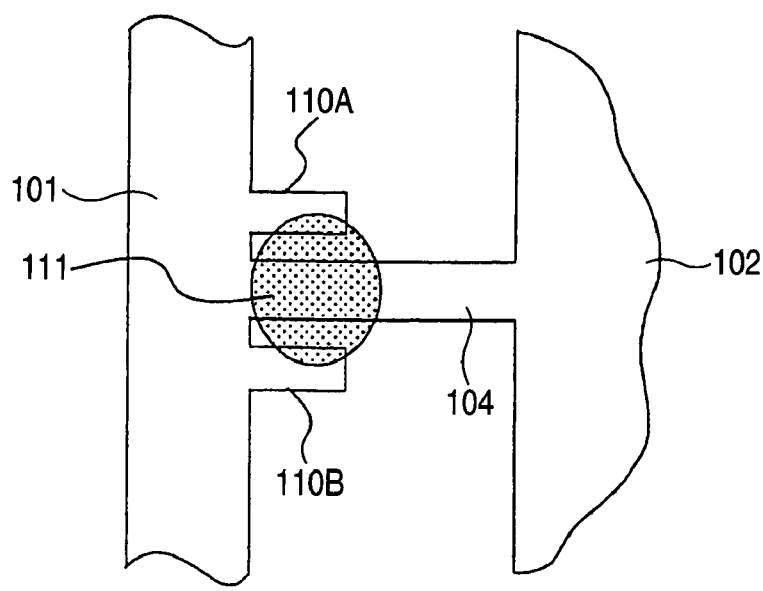

FIG. 1 is an upper view showing the schematic constitution of an MEMS mirror device 100 according to a first embodiment of the invention. FIG. 2 is an exploded perspective view thereof. FIGS. 3A and 3B is an enlarged view of a connecting portion between a first frame 101 and a hinge 104, in which FIG. 3A shows a state before forming an elastic member 111 and FIG. 3B shows a state after forming the elastic member 111.

As shown in FIGS. 1 to 3B, a mirror unit 102 is connected via two hinges 104, 104 inside the first frame 101, and a second frame 102 is provided with the permanent magnets 105A, 105B inwardly of the side parallel to the hinge 104. The MEMS mirror device of this embodiment consists of the first frame 101 and the second frame 102 that are jointed.

Figure 6:
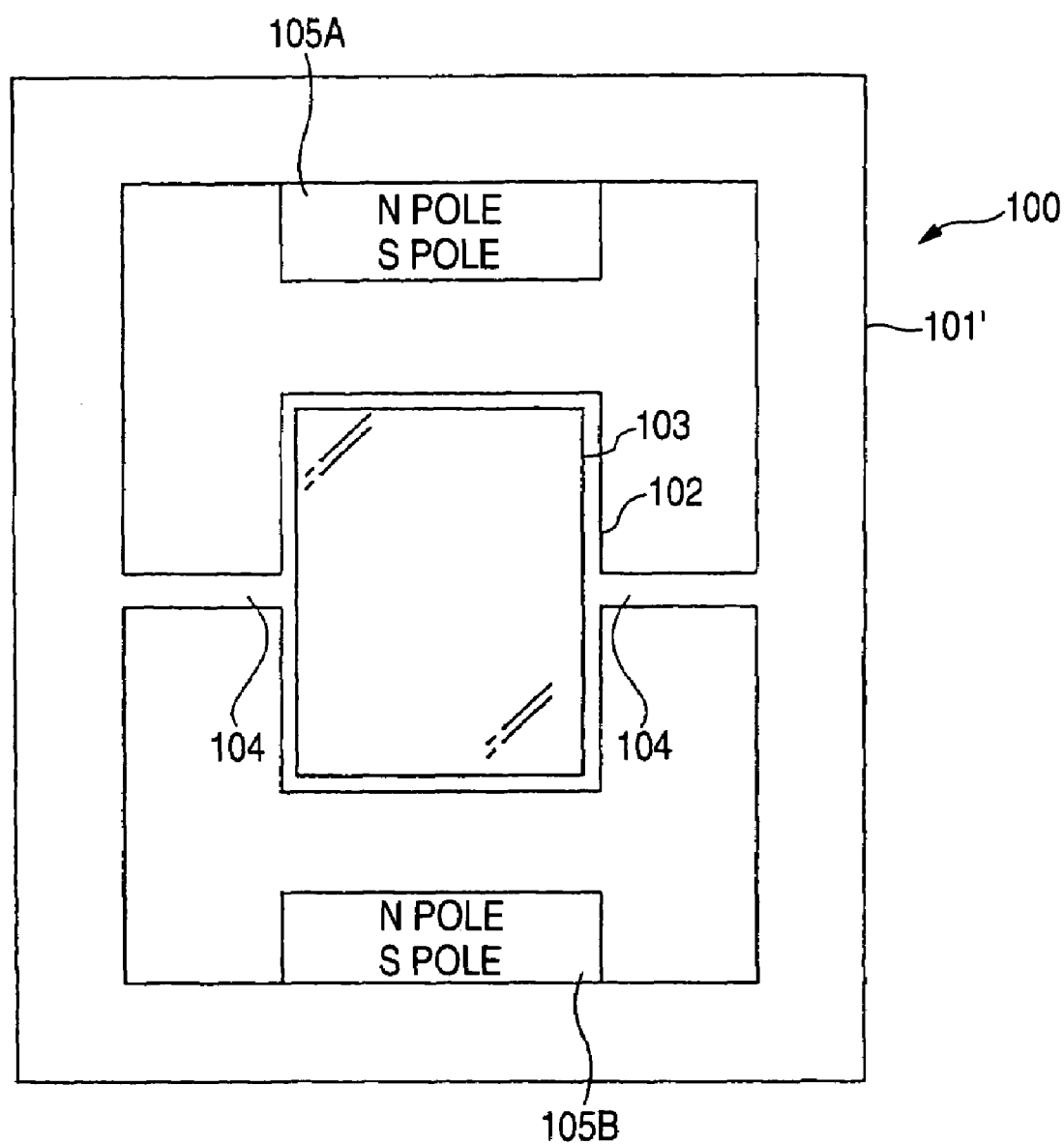
FIG. 6 is an upper view showing the schematic constitution of the conventional MEMS mirror device 100.

The first frame 101 has two protruding portions 110A, 110B spaced at a regular interval and disposed on both sides of the connecting portion between the frame 101 and the hinge 104. And an elastic member 111 is formed to bridge the hinge 104 between two protruding portions 110A, 110B. In this way, the MEMS mirror device of this embodiment is different from the conventional MEMS mirror device (see FIG. 6) in that the elastic member 111 is provided in the connecting portion between the frame 101 and the hinge 104.

This elastic member 111 is formed of high molecular resin denaturalized like a gel. More specifically, the elastic member 111 is coated with UV curable resin material such as silicone between two protruding portions 110A and 110B formed on the first frame 101, UV irradiated, and cured like gel, for example. In this case, a space 112 formed between the protruding portions 110A, 110B provided in the first frame and the hinge 104 serves as a liquid pool, whereby the elastic member 111 is easily formed. Also, to reduce the resonance peak amount of the MEMS mirror device 100, it is desirable that the cured elastic member 111 is like gel near sol.

Also, the first frame 101, the mirror unit 102 and the hinge 104 can be formed on a single Si substrate through micro processing by dry etching. Accordingly, the protruding portions 110A, 110B are provided in the first frame 101, for which there is no need for increasing the number of steps, and each part is formed relatively easily.

The mirror unit 102 is formed with a reflecting face 103 by gold deposition on one face, with an electromagnetic coil 106 wired around the peripheral part of the mirror unit 102 on the other face. An end part of the electromagnetic coil 106 is electrically connected with an electrode pad 107 extending from two hinges 104, 104 and provided in the frame 101. Other members such as insulating films are not illustrated, except for the electromagnetic coil 106. Also, the coil wiring is actually a multiple winding but a single winding in the figure.

The second frame 120 is made of material such as iron, with the permanent magnets 105A, 105B fixed inside the parallel side of the second frame to the hinge 104 in the manner that their opposed magnetic poles are opposite. The drive unit for the mirror unit 102 is constituted of the electromagnetic coil 106 provided on the back face of the mirror unit 102 and the permanent magnets 105A, 105B fixed to the second frame 120.

Herein, the specific oscillating motion of the mirror unit 102 will be described below. If a voltage is applied to the electrode pad 107 on the frame 101, a current flows through the electromagnetic coil 106, so that the portion parallel to the permanent magnets 105A, 105B of the electromagnetic coil 106 is subject to a Lorentz force in the thickness direction of the mirror unit 102 due to interaction with a magnetic field B produced by the permanent magnets 105A, 105B. As a result, the mirror unit 102 is oscillated around the two hinges 104, 104 as the axis, and stands still at an angle where the Lorentz force and a torsional rigidity of the hinge 104 are balanced. At this time, the mirror 102 can be tilted by a desired angle by changing the magnitude of current flowing through the electromagnetic coil 106.

Also, the MEMS mirror device 100 of this embodiment is provided with the elastic member 111 in the connecting portion between the hinge 104 and the first frame 101, whereby the resonance peak amount is reduced to about half (e.g., 15 dB) of the conventional value.

Figure 4:
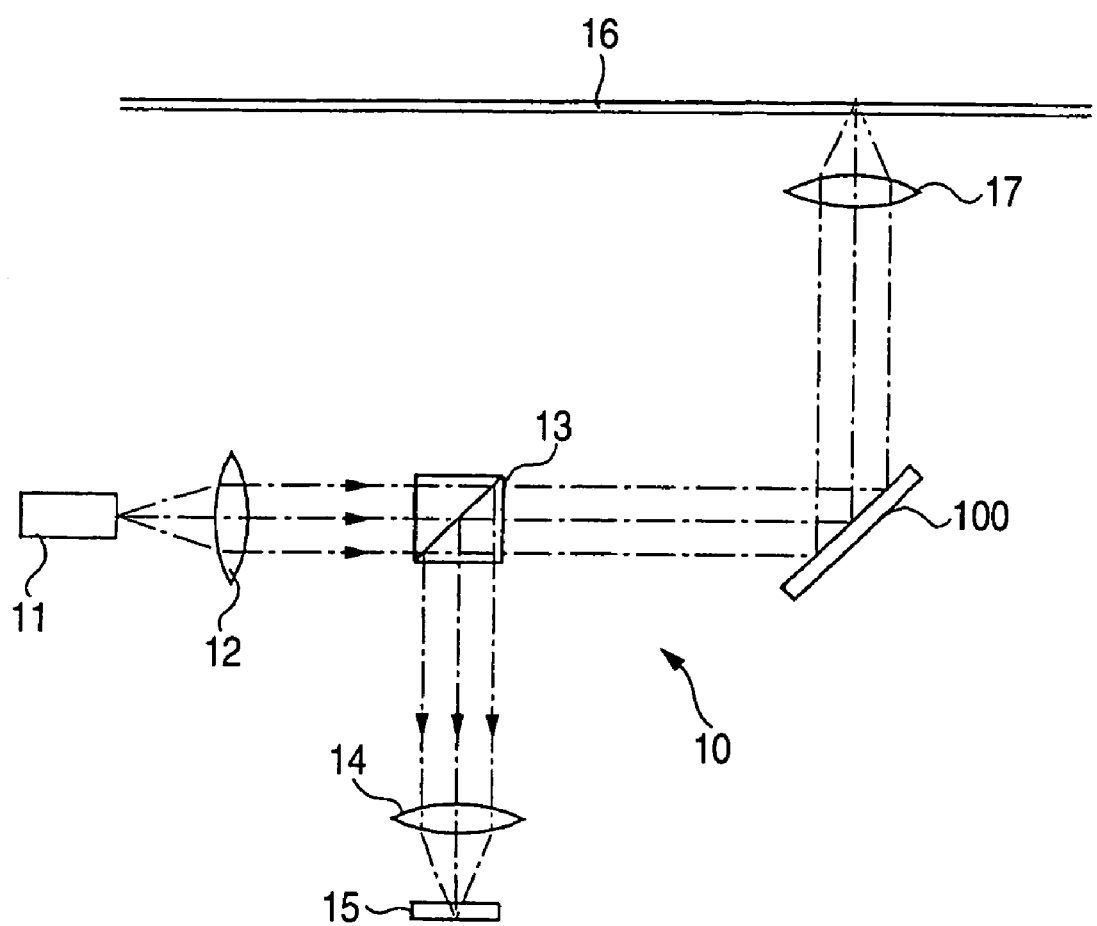
FIG. 4 is a schematic view showing an optical pickup system of an optical disk apparatus with the MEMS mirror device 100 according to the first embodiment.

FIG. 4 is a schematic view showing an optical pickup system of an optical disk apparatus with the MEMS mirror device 100 as described above. The optical pickup system of the optical disk apparatus 10 according to this embodiment includes a light source (semiconductor laser: LD) 11, an MEMS mirror device 100 for reflecting a laser beam from the light source 11 to be incident on an objective lens 17, the objective lens 17 for focusing a laser beam reflected from the MEMS mirror device 100 onto the surface of a recording medium 16, a photodetector 15 for detecting various kinds of signal from the light reflected from the recording medium 16, a beam splitter 13 for leading the laser beam to proceed on a predetermined route, a collimator lens 12 for transforming laser beam into a parallel light and a condensing lens 14 for condensing the parallel light.

Also, the objective lens 17 is secured to an actuator, not shown, which makes the focusing control for focusing a focusing point (light spot) of laser beam on the recording medium 16 in accordance with irregularities or vibration of the recording medium, and the tracking control for tracking the light spot on the signal track.

Further, the tracking control is performed by tilting the mirror unit 102 of the MEMS mirror device 100 by a minute angle to displace the light spot on the recording medium 16 in the radial direction of the recording medium. The displacement amount of light spit by the MEMS mirror device 100 is smaller than the displacement amount of light spot by the actuator, and can be adjusted in the order of 0.01. m, for example.

In the optical disk apparatus 10 with the above constitution, the position of light spot in the track direction is corrected under the tracking control at two stages in which coarse adjustment is made in a low frequency domain (e.g., below 2 kHz) by the actuator, and fine adjustment is made in a high frequency domain (e.g., from 2 to 10 kHz) by the MEMS mirror device 100.

Also, the resonance peak amount of the MEMS mirror device 100 is about 15 dB, or remarkably smaller than that of the conventional MEMS mirror device, whereby the stable tracking control is enabled by the MEMS mirror device 100. Accordingly, the MEMS mirror device 100 can cope with the cases where the track pitch is narrower along with the higher density of the recording medium.

(Second Embodiment)

Figure 5:
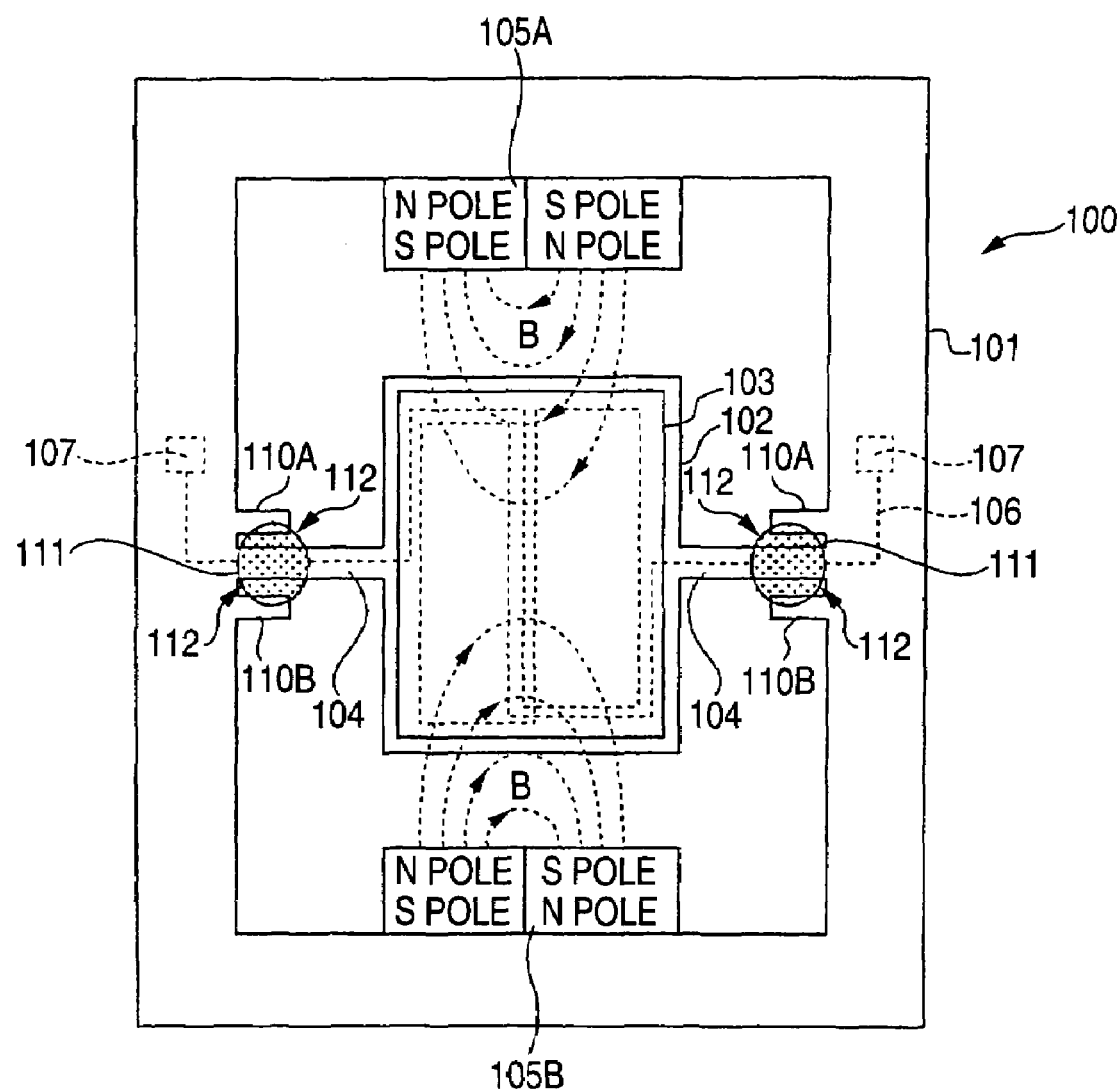
FIG. 5 is an upper view showing the schematic constitution of the MEMS mirror device 100 according to a second embodiment of the invention.

FIG. 5 is an upper view showing the schematic constitution of the MEMS mirror device 100 according to a second embodiment of the invention.

The MEMS mirror device of the second embodiment is the same as that of the first embodiment, except for the wiring of the electromagnetic coil 106 and the constitution of the permanent magnet 105. That is, though the electromagnetic coil 106 is wired around the peripheral part of the mirror unit in the first embodiment, the electromagnetic coil 106 is wired like eight-figure in the second embodiment. The coil wiring is actually the multiple wiring but the single wiring in FIG. 5.

Also, though the magnetic field B generated by the permanent magnet 105 is open in the first embodiment, the magnetic field B' generated by the permanent magnet 105 is closed (closed loop) in the second embodiment. That is, the permanent magnet is magnetized so that both the N pole and S pole appear in the long side direction of the permanent magnet 105, to generate the magnetic field of closed loop inside the frame 101.

In the second embodiment, the magnetic field B' generated by the permanent magnet 105 is closed loop, whereby the intensity of magnetic field at a predetermined portion of the electromagnetic coil 106 is stabilized. Accordingly, the electromagnetic conversion efficiency, and the operation characteristics of the MEMS mirror are improved.

Though the invention made by the present inventor has been specifically described above in connection with the embodiment, the invention is not limited to the above embodiment.

For example, though the MEMS mirror device of electromagnetic drive type in which the electromagnetic coil 106 and the permanent magnet 105 are employed as a drive unit has been described in the above embodiment, this invention is also applied to the MEMS mirror device of electrostatic drive type.

Also, the wiring of the electromagnetic coil 106 and the magnetizing mode of the permanent magnet 105 maybe appropriately changed in the above embodiment. Also, the arrangement of the electromagnetic coil 106 and the permanent magnet 105 may be reversed.

Since this invention provides an MEMS mirror device including a rectangular frame, a mirror unit having a reflecting portion on one face thereof and connected via the hinges inside the frame, and a drive unit for tilting the mirror unit around the hinges as the axis, wherein the frame has two protruding portions spaced at a regular interval and extending into the frame on both sides of a connected portion with the hinge, and an elastic member is provided to bridge the hinge between two protruding portions, the resonance peak amount of the MEMS mirror device is reduced. Accordingly, the optical disk apparatus with the MEMS mirror device can make the correct tracking control.

Also, since the protruding portions are provided on both sides of the connecting portion between the frame and the hinge, and when sol-like resin material is coated to bridge the bridge between two protruding portions, a liquid pool is formed, the elastic member is easily formed.

What is claimed is:

1. An MEMS mirror device comprising:
   a rectangular frame;
   a mirror unit including a reflecting portion on one face thereof, connected via hinges inside the frame and formed on the same plane as the frame;
   a drive unit including an electromagnetic coil of eight-figure type wired on the other face of the reflecting portion of the mirror unit, and a permanent magnets;
   an elastic unit, wherein:
   the frame, the mirror unit, and the hinges are integrally formed of the same material;
   the frame has two protruding portions spaced at a regular interval and extending into the frame on both sides of a connected portion with the hinge;
   the drive unit oscillates the mirror unit around an oscillating axis with the hinges;
   the permanent magnets generates a magnetic field to cause a Lorentz force in a direction for oscillating the mirror unit in a predetermined part of the electromagnetic coil in flowing a current through the electromagnetic coil; and
   the elastic unit made of gel-like high molecular resin is provided to bridge the hinge between the two protruding portions.

2. A MEMS mirror device comprising:
   a rectangular frame;
   a mirror unit including a reflecting portion on one face thereof, connected via hinges inside the frame and formed on the same plane as the frame;
   a drive unit;
   an elastic unit, wherein:
   the frame has two protruding portions spaced at a regular interval and extending into the frame on both sides of a connected portion with the hinge;
   the drive unit oscillates the mirror unit around an oscillating axis with the hinges; and
   the elastic unit is provided to bridge the hinge between the two protruding portions.

3. The MEMS mirror device according to claim 2, wherein
   the elastic unit is made of gel-like high molecular resin.

4. The MEMS mirror device according to claim 2, wherein
   the frame, the mirror unit, and the hinges are integrally formed of the same material.

5. The MEMS mirror device according to claim 2, wherein:
   the drive unit is composed of an electromagnetic coil wired on the other face of the mirror unit on which a reflecting portion is provided, and the permanent magnets for generating a magnetic field to cause a Lorentz force in a direction for oscillating the mirror unit in a predetermined part of the electromagnetic coil in flowing a current through the electromagnetic coil.

6. The MEMS mirror device according to claim 5, wherein
   the electromagnetic coil is wired in eight-figure type, and the permanent magnet is magnetized to generate a magnetic field like a loop in a predetermined part of the electromagnetic coil.

7. An optical disk apparatus comprising:
   a MEMS mirror device including a rectangular frame, a mirror unit including a reflecting portion on one face thereof, connected via hinges inside the frame and formed on the same plane as the frame, a drive unit, and an elastic unit,
   a light source for emitting light; and
   an objective lens, wherein:
   the frame has two protruding portions spaced at a regular interval and extending into the frame on both sides of a connected portion with the hinge;
   the drive unit oscillates the mirror unit around an oscillating axis with the hinges;
   the elastic unit is provided to bridge the hinge between the two protruding portions;
   the light emitted from the light source is reflected at the MEMS mirror device; and
   the reflected light is directed via the objective lens onto a recording medium to record or reproduce the information.

* * * * *